(12) United States Patent
Dekempeneer et al.

(10) Patent No.: US 9,082,595 B2
(45) Date of Patent: Jul. 14, 2015

(54) SPUTTERING APPARATUS

(75) Inventors: Erik Dekempeneer, Oostmalle (BE); Wilmert De Bosscher, Drongen (BE); Pascal Verheyen, Gavere (BE)

(73) Assignee: SULZER METAPLAS GMBH, Bergisch Gladbach (DE)

( * ) Notice: Subject to any disclaimer, the term of this patent is extended or adjusted under 35 U.S.C. 154(b) by 611 days.

(21) Appl. No.: 12/293,891

(22) PCT Filed: Mar. 14, 2007

(86) PCT No.: PCT/EP2007/052374
§ 371 (c)(1),
(2), (4) Date: Sep. 22, 2008

(87) PCT Pub. No.: WO2007/110322
PCT Pub. Date: Oct. 4, 2007

(65) Prior Publication Data
US 2009/0114529 A1 May 7, 2009

(30) Foreign Application Priority Data
Mar. 28, 2006 (EP) .................................. 06111843

(51) Int. Cl.
C23C 14/00 (2006.01)
C25B 11/00 (2006.01)
C25B 13/00 (2006.01)
H01J 37/34 (2006.01)
C23C 14/34 (2006.01)
C23C 14/56 (2006.01)

(52) U.S. Cl.
CPC ............ *H01J 37/3405* (2013.01); *C23C 14/34* (2013.01); *C23C 14/56* (2013.01); *H01J 37/3447* (2013.01)

(58) Field of Classification Search
CPC ............ H01J 37/32651; H01J 37/3441; H01J 37/3447
USPC ............ 118/418, 49.5; 204/298, 192, 298.02, 204/192.12, 28
See application file for complete search history.

(56) References Cited

U.S. PATENT DOCUMENTS 4,080,281 A * 3/1978 Endo .................. 204/298.28
4,126,530 A    11/1978 Thornton
4,294,678 A    10/1981 Kuehnle
4,407,713 A    10/1983 Zega (Continued)

FOREIGN PATENT DOCUMENTS

DE    40 11 515 C1   12/1990
EP     0 521 045 B1    1/1993

(Continued)

Primary Examiner — Roy King
Assistant Examiner — Jenny Wu
(74) Attorney, Agent, or Firm — Foley & Lardner LLP

(57) ABSTRACT

A coating apparatus is revealed that is designed to coat substrates by means of a physical vacuum deposition process or a chemical vacuum deposition process or a combination thereof. Said coating apparatus is particular in that it uses a rotatable magnetron (14) that is coverable with an axially moveable shutter (18). Such an arrangement enables to keep the magnetron target clean or to clean the target in between or even during subsequent coating steps. The shutter further provides for a controllable gas atmosphere in the vicinity of the target. The arrangement wherein the magnetron is centrally placed is described. Substrates are then exposed to the sputtering source from all angles by hanging them on a planetary carousel (24) that turns around the magnetron.

12 Claims, 4 Drawing Sheets

(56) References Cited

U.S. PATENT DOCUMENTS

| | | | |
|---|---|---|---|
| 5,108,874 A | | 4/1992 | Griffing et al. |
| 5,787,056 A | * | 7/1998 | Nakayama et al. ........ 369/13.44 |
| 5,795,448 A | * | 8/1998 | Hurwitt et al. ............. 204/192.1 |
| 6,045,667 A | | 4/2000 | Moll |
| 6,264,803 B1 | | 7/2001 | Morgan et al. |
| 6,315,877 B1 | | 11/2001 | Goedicke et al. |
| 6,740,393 B1 | | 5/2004 | Massler et al. |
| 6,929,724 B2 | | 8/2005 | Green et al. |
| 7,160,616 B2 | | 1/2007 | Massler et al. |
| 2001/0008207 A1 | * | 7/2001 | Ando et al. .............. 204/192.28 |
| 2002/0108571 A1 | * | 8/2002 | Black et al. .................... 118/715 |
| 2004/0178056 A1 | * | 9/2004 | De Bosscher et al. ... 204/192.12 |

FOREIGN PATENT DOCUMENTS

| | | |
|---|---|---|
| JP | 59-178367 U | 11/1984 |
| JP | 2-251143 A | 10/1990 |
| JP | 11-343568 A | 12/1999 |
| JP | 2001-131739 A | 5/2001 |
| JP | 2004-277798 A | 10/2004 |
| WO | WO 01/79585 A1 | 10/2001 |
| WO | WO 2005/014882 A1 | 2/2005 |
| WO | WO 2005/098898 A1 | 10/2005 |

\* cited by examiner

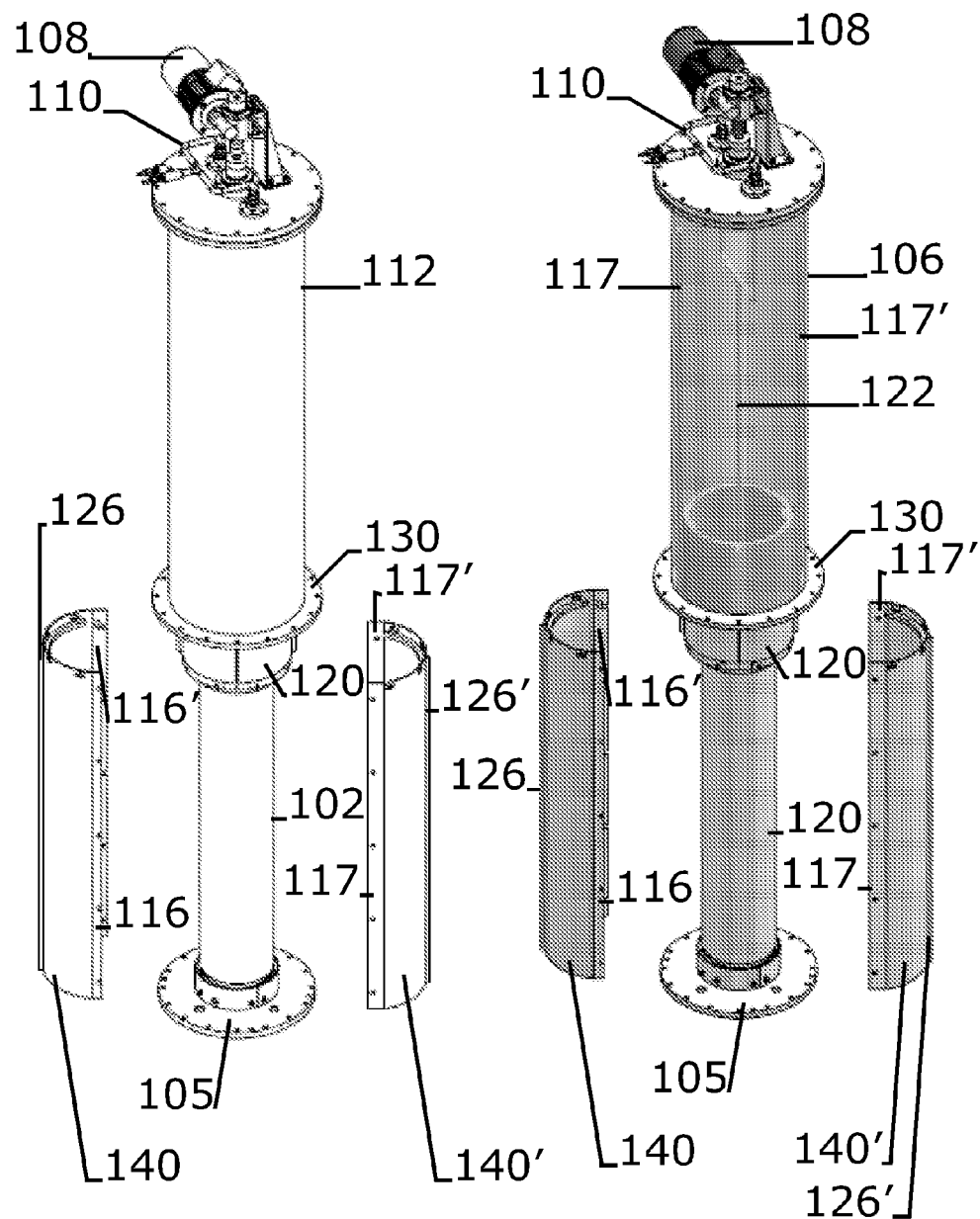

SPUTTERING APPARATUS

FIELD OF THE INVENTION

The invention relates to a coating apparatus that uses a rotatable target as a sputter material source. The coating apparatus is equipped with a tubular shutter that can be axially extended over or axially retracted from the sputter zone of the target. The apparatus is particularly intended for mixed mode coating processes in which physical vapour deposition (PVD) processes alternate with chemical vapour deposition (CVD) processes or are effected simultaneously.

BACKGROUND OF THE INVENTION

In the art of deposition of optically, electrically, chemically, magnetically or mechanically functional coatings, the physical vapour deposition (PVD) and the chemical vapour deposition (CVD) prevail. Physical vapour deposition relates to processes wherein the coating is built-up by a ballistic shower of the substrate with coating atoms. The coating atoms originate from a usually solid, sometimes liquid 'target'. A preferred way of transferring the target species to the substrate is to bombard the target with high kinetic energy ions. A plasma of an inert gas—typically a noble gas such as argon—acts as a source of ions. The ions gain kinetic energy as they are accelerated towards the negatively biased target and eject the target atoms towards the substrate. Such a process is called 'sputter deposition'. The plasma can be confined in the vicinity of the target surface by means of magnetic fields originating from magnets placed at the side of the target opposite to the plasma side, a process referred to as 'magnetron sputter deposition'. The target can be fed with a direct current, pulsed direct current or alternating current power source. When now a reactive gas—such as oxygen or nitrogen—is admitted to the argon, a compound layer will be formed at the surface of the substrate, a process referred to as 'reactive magnetron sputter deposition'. In another variant of the 'magnetron sputter deposition', the magnetron can be made 'unbalanced' as opposed to 'balanced'. With 'unbalanced' is meant that part of the magnetic field lines do not close on the target surface but fan out to the substrate. Electrons gyrating around these field lines then can reach the substrate and create a local plasma. Such a process is called 'unbalanced magnetron sputtering'.

The ion current towards the substrate can be controlled by properly biasing the substrate with respect to the rest of the installation or by isolating the substrate making it floating with respect to the rest of the installation. A self-bias will then develop that attracts ions to the substrate. Such a current of impinging ions leads to a further densification of the deposited layer, a process that is known as 'ion plating'.

Chemical vapour deposition is in essence a process in which a gaseous precursor—usually a hydrocarbon—is excited so that radicals form that subsequently chemically react at the surface of the blank or already coated substrate. Excitation of the gaseous precursor can be achieved with a variety of means:
- By thermal activation of the precursor. Heating of the gas can be achieved by heating the substrate or the walls of the reactor, or by using heater wires (hot wire CVD). Using heater wires has the additional advantage that thermally emitted electrons add to the activation degree of the precursor gas.
- By irradiation with visible (photochemical vapour deposition), infrared or microwave electromagnetic waves.
- Through excitement in a plasma (plasma activated CVD, PA CVD). To this end a noble gas atoms, usually argon, is mixed with the precursor gas in order to generate a plasma, that subsequently generates radicals in the precursor gas. The plasma can be excited by means of a radiofrequent electromagnetic field (typically 13.56 MHz).
- A variant to this technique, called plasma enhanced CVD (PE CVD) uses an unbalanced magnetron to fan out the target plasma towards the substrate so that ion plating occurs.

Many times, different modes of activation are mixed in order to control coating properties or to enhance the speed of coating.

For the purpose of this application, a process will be considered to be:
- a PVD process as long as atoms are being dislodged from the target
- a CVD process as long as precursor gas radicals are present in the apparatus
- a 'mixed process' when target atoms are being dislodged while organic precursor molecules are present.

More and more technologically important coatings are being produced involving complex stacks of layers deposited by PVD, reactive PVD and CVD and gradient layers that involve a mixture of both processes at the same time. One such a stack is e.g. described in WO 2005/014882 wherein first a Ti layer is deposited on a substrate (by means of magnetron sputtering), followed by a layer of TiN (by means of reactive magnetron sputtering), followed by a Ti layer that gradually changes to from a TiC (mixed process) into a diamond like coating (DLC, chemical vapour deposition). The specific coatings are used as hard and wear resistant coatings in various applications.

The combination of both processes in one single apparatus poses many technological challenges to the equipment as the requirements of both processes are differing. For example, plasma sputtering processes normally take place at pressures between 0.01 and 100 Pa, whereas chemical vapour deposition processes can take place at pressures anywhere between 1 Pa and atmospheric pressure. Also the coating mechanism differs. In the PVD process, the flux of coating particles can be more or less directed towards the substrate. This necessitates the introduction of planetary carrousels to carry the substrates so that each and every spot on the sometimes complexly curved substrates is reached. The CVD process is based on diffusion and conformally coats the substrate. But it also tends to cover the whole deposition chamber including the sputtering target present in the chamber. This sputtering target gets covered with a CVD layer that disturbs the PVD process during the next use of the target. Also in the 'mixed mode' process wherein sputtering is combined with the administering of an inert and precursor gas (e.g. the sputtering of a Ti target in a acetylene ($C_2H_2$)-argon mixture) is difficult to control as a compound layer not only forms on the substrate, but also on the target which leads to undesirable phenomena like arcing (leading to the ejection of larger pieces out of a target) and instability of the process. Therefore a 'target contamination' problem exists in these processes.

Many reactors have been described that make possible 'mixed processes'. There is for example the coater described in WO01/79585 that shows planar targets mounted at the outer walls of an evacuable chamber. Other sources for excitement of precursor gasses are provided in the form of a low-voltage arc that can be drawn between a hot filament cathode and an anode. Densification of the layer formed is provided with a pulsed DC excitation between substrate and plasma. Other reactors all using planar targets are described in DE 4011515, U.S. Pat. Nos. 6,045,667, 6,315,877 and EP 0521045.

SUMMARY OF THE INVENTION

It is an object of the current invention to provide an apparatus for coating substrates that allows for a stable and clean mixed mode deposition process. It is a further object of the invention to provide a process that does away with the problem of target contamination in a mixed mode reactor. Another object of the invention is to provide an apparatus and a method that allows for a time-efficient process schedule.

According a first aspect of the invention, an apparatus for coating substrates is presented. At first instance, the apparatus is intended to provide many relatively small substrates with a functional coating. The substrates can be parts of a machine or an engine or an apparatus and are normally monolithic i.e. not assembled out of other components. By preference the substrates are high-temperature resistant as the processes can entail a high heat load to the substrate. Hence, the substrates are predominantly made of metals such as steel as it is known in all its forms and compositions. The coating that is applied may impart specific desirable optical, electrical, magnetic, chemical or mechanical properties to the substrate. The apparatus is intended preferably to coat the substrate with mechanical functional coatings such as anti-friction coatings, wear resistant coatings and the like. More specifically the apparatus is especially—but not exclusively—intended to coat substrates with coatings comprising a stack of layers that are applied with different kinds of processes, notably CVD or PVD or a combination of both. Such stacks preferably comprise a layer of a metal out of the group IVB, group VB or group VIB of the periodic table, a layer of the carbide or nitride of said metal, a diamond like layer or a diamond like nanocomposite layer as they are known in the art.

Such an apparatus is in essence a chamber that is provided with the necessary ancillary equipment such as pumps, pressure gauges, feedthroughs to evacuate the chamber. Different excitation means may be provided in said chamber as they are known in the art of chemical vapour deposition: hot wire heating sources, RF antenna's to couple electromagnetic energy into the plasma, low voltage plasma arcs and the like. In addition one or more magnetron targets may be present in the evacuable chamber. Contrary to the known apparatus that solely use planar magnetrons in these kind of mixed processes, the inventive apparatus comprises a cylindrical magnetron. Such cylindrical magnetrons are known in the art although mainly in the field of large area sputtering. The use of such a rotatable target in a mixed mode reactor has however not been considered hitherto.

In essence such a cylindrical magnetron comprises a cylindrical target tube in which a magnet array is provided. The magnet field lines penetrate through the target tube and define a preferred sputter area at the outer surface of the target when the apparatus is operative. During operation one or more closed plasma loops commonly called racetracks are formed at the surface of the target, reflecting the arrangement of the magnets in the magnet array. Radial under these racetracks the target material is eroded away very fast, while outside the racetracks, erosion is negligible. As in the racetracks, the target material is ejected away in a preferred direction, the placement of the magnet array should be such that it is directed towards the substrates to be coated.

The benefits of the cylindrical target vis-à-vis the planar target become prominent when there is a relative motion between the target and the magnet array. Such a relative motion continuously feeds new material in the racetracks, leading to a uniform use of the target material on the backing tube. In addition, the relative movement reduces the formation of a compound layer on the target in the case of reactive sputtering or mixed mode vapour deposition. Indeed, first the formed compound layer is eroded away in the racetrack, revealing fresh target material that is subsequently sputtered. Consequently the target contamination is reduced, leading to a more stable process.

The relative movement between magnet array and cylindrical target can be in the axial direction or in the tangential direction. In this invention the relative motion between target and magnet array is in the tangential direction although the ideas can be easily extended to an axial movement. Both the magnet array and the target can move, or the target can rotate while the magnet array remains fixed or the target can remain fixed while the magnet array moves. The latter two movements are preferred in that they impart less complicated mechanisms, e.g. the last one does not necessitate the use of rotary vacuum or coolant seals.

The magnet array can be of the balanced type. As the shape of the racetrack is determined by the magnet array many types of magnet array configurations have been described. The magnet arrays can be of the directional type having one or more loops, the loops defining directions in which the material is preferentially sputtered away (such as described in U.S. Pat. No. 6,264,803. Or they can be of the omnidirectional type wherein the material is sputtered away in substantially equiangular directions as for example described in U.S. Pat. No. 4,407,713. More preferred is if the magnet array is of the unbalanced type. In WO2005/098898 A1 an omnidirectional unbalanced type is described wherein two closed loops form that are meandering lengthwise over the surface of the target.

Distinctive for the inventive apparatus is that a tubular shutter is provided that is axially extendable and retractable over the cylindrical target. The shutter can at least cover the area that is sputtered during operation. Various types of shutters are known in the art but all of them relate to covering of planar targets of rectangular (U.S. Pat. No. 4,294,678) or circular (U.S. Pat. No. 6,929,724) shape. It should also be pointed out here that there is a clear distinction between what is called a "shield" and a "shutter". A shield is an electrically conducting member that does NOT substantially cover the sputtering zone. Examples of shields in the field of rotatable targets can for example be found in U.S. Pat. No. 5,108,874 where a cylindrical shield is described that leaves open the sputter area and is mounted close to the target. The purpose of a shield is to eliminate the formation of a plasma where it is not desired by locally screening off the plasma from the target potential. The purpose of a shutter is to interrupt the stream of ions emanating from the sputtering zone.

The axial movement of the shutter can be implemented in various ways. Three rack and pinion arrangements—where the rack is mounted on the outer surface of the shutter and the pinion is motor driven—that are equiangularly disposed around the shutter is a first preferable way to implement the axial movement. Another preferable way to implement the movement is the use of a screw-threaded rod coaxially mounted to the axis of the tubular shutter that turns in a nut fixed to a cover at one end of the shutter. Another preferred way is to have the tubular shutter suspended from a winding axle by means of one or more steel wire cables. In this arrangement the tubular target is standing upright and the shutter—suspended on its cables—axially slides up- and downward over the target. A variant to this embodiment is a sprocket and chain lifting system. For each implementation the use of a guiding rail is preferred in order to control the movement of the shutter. Proximity detectors can be used as an input to the driving motor in order to have a defined start and stop position.

Further provisions in the apparatus are foreseen to have a separate gas feed between the target and the tubular shutter. Such a gas feed preferably feeds a noble gas in between the gap between the target and shutter.

The shutter is preferentially made out of an electrically conductive material, although dielectric materials could be envisaged too (such as e.g. glass, preferably high temperature resistant glass such as fused quartz like Pyrex®). By preference the shutter is made of metal, notably a high temperature resistant metal such as stainless steel or a titanium alloy or even certain aluminium alloys. Other metals or alloys are also possible when e.g. the thickness is adapted to withstand the plasma environment over a sufficiently long time. The shutter may be electrically floating with respect to the environment, but more preferred is if the electrical potential of the shutter can be controlled relative to one of following references: the potential of the chamber or the potential of the target or the potential of the substrates. Most preferred is if the shutter and the chamber are held at the same potential.

By preference the gap between target and shutter is sufficiently large to allow for a plasma to ignite. Before a plasma ignites various conditions have to be met. The gas density (controlled by the pressure) must be low enough in order to have a sufficient mean free path for the ions to accelerate and liberate secondary electrons from the cathode. On the other hand the gas density must not be too low as otherwise not enough collisions take place. The field strength must be high enough and the mean free path of the electrons must be long enough to allow electrons to gain sufficient energy to ionise the neutral atoms in the gas. While in the plasma there is charge balance between electrons and ions, and hence the potential is relatively constant, this is not so in the vicinity of the target cathode where most of the potential drops. There, a dark space will form above the target as electrons gain their kinetic energy and are not able to ionise the gas atoms. When the gap between target and shutter is smaller than this dark space thickness, no plasma will start. The person skilled in the art knows this delicate balance of parameters and knows that a certain gap is needed in order to ignite the plasma.

For practical attainable voltages and current densities, the inventors have found that a minimum distance of 3 cm suffices to ignite a plasma between the target and the shutter. More preferred is a distance of 4 or even 5 cm. Larger distances are more preferred but this requirement collides with the space limitations inside such an apparatus.

In another preferred embodiment of the invention, the shutter does not only cover the sputtering area, but the complete target when it is in the extended position. Mutatis mutandis, the target is completely uncovered when it is in the retracted position. This fully prevents shadowing effects that can still occur when only the sputtering region is covered.

When the closing of the shutter is sufficient to retain the gas around the target, two separate environments can be maintained in the apparatus. This becomes possible if the leaks out of the shutter are not too large. For example in the vicinity of the target, an atmosphere can be maintained that contains more noble gas than the rest of the apparatus. Even more preferred is when the shutter provides a gastight enclosure. With gastight it is meant that inside the shutter little or no gas leaks into the gas atmosphere outside the shutter and vice versa, under the provision that the gas pressures at either side are comparable. Gastight does not imply 'vacuum tight', when not only gas separation is intended, but also a pressure difference has to be overcome. A gastight enclosure allows the existence of two different atmospheres in one single apparatus: inside the enclosure a cleaning plasma can be maintained in order to clean the surface of the target, while outside the enclosure the substrates are isolated from said cleaning operation. Mutatis mutandis, the target can be isolated from the chemical vapour deposition occurring outside the extended shutter thus preventing contamination of the target.

The shutter can be made out of a single piece of tube. However, this may make the cleaning or the replacement of the tube somewhat cumbersome as the tube has to be slid over the target tube if one does not want to remove the target tube. Therefore it is preferred that the tubular shutter is made out of several segments that form a tubular enclosure once assembled together. Most preferred is if the shutter is made out of two laterally fitting tube halves that when bolted together form the shutter. Other means for attaching the two halves to one another can of course be thought on such as snap fits or clamps.

As the most preferred configuration is that the target emits material in all radial outward directions, it follows that the configuration wherein the target and shutter are mounted substantially centrally with respect to the chamber is most preferred. Hence the substrates must be arranged around this target.

As the sputtering process is in essence a directional deposition technique it may be necessary to expose the whole surface or at least selected surfaces of the substrates to the incident coating flux. This is normally accomplished by means of a planetary substrate holder. Such holders may provide different levels of rotation to substrate carriers standing or hanging from the planetary substrate holder. At least a first level of rotation is needed in case one uses a fixed magnet array that has an equiangulary radial distribution in order to average out the non-uniformity in the radial distribution flux. The axis of rotation of the first level coincides with the target axis (the 'Sun') and the substrate holders (the 'planets') describe a circular orbit around said target. A second level of rotation can be added wherein points revolving on the first level orbit act as centres of rotation of a second level. The radius of this second level rotation must be smaller than the radius of the first level rotation. The substrate holders then describe a substantially hypocycloidal orbit (in case the rotation direction of the first and second level rotation is opposite to one another) or epicycloidal orbit (in case the rotation direction of the first and second level rotation is equal to one another). More levels can be added to the planetary system. Finally, the substrate holders themselves may also rotate around their axis of rotation. It is preferred that at least three levels of rotation are present, more preferred is if four levels of rotation are present. The substrates are held at an adjustable electrical potential or are floating with respect to the earth potential. To this end, the whole planetary system is electrically conductive but isolated from the environment and an electrical feedthrough is provided for electrical potential control.

According a second aspect of the invention a time-efficient process schedule is provided. As usually the coating of the substrates is a batch process, a lot of time is spent with pumping down of the chamber, heating of the chamber, sputter cleaning, venting etc. . . . It is therefore advantageous to reduce these steps or to make them concurrently. An inventive method to coat substrates therefore comprises the following steps:

a.) First the substrates are attached to the substrate carriers. The carriers are then loaded on the planetary substrate holder in the chamber.

b.) The chamber is pumped down to a base pressure. The chamber may in the meantime be flushed with argon gas. Also the substrates can be subjected to a plasma etch by applying the proper bias to them.

c.) A predetermined sequence of coating processes is initiated and a layered coating stack is formed on said substrates. The processes are chosen out of the group of sputter deposition, reactive sputter deposition, and chemical vapour deposition or a combination thereof. By preference the sequence will be: sputter deposition, reactive sputter deposition, reactive sputter deposition in combination with chemical vapour deposition, chemical vapour deposition with a hydrocarbon precursor gas. During each process step, the necessary process conditions such as target potential, substrate bias, gas pressures and flows, temperatures, rotation speeds of the planetary substrate holder and others are controlled.

d.) When the stack is completed, all coating processes are stopped.

e.) The chamber is vented—preferably with air, but other gases can be used as well—and cooled down and the substrates on their carriers are removed from the chamber.

Characteristic about this process is that at any moment there is the possibility to introduce between the steps or perform concurrently during a step the substeps of:

Having the shutter extended over the area where sputtering will occur. The shutter can already be in the extended position or it can be brought in the extended position.

Realising the appropriate gas pressure between target and shutter so that a plasma can be ignited.

Ignition of a plasma between target and shutter by feeding electrical power to the target.

While the plasma is on, one can retract the shutter. This is useful when depositing the first metallic layer: first the target is cleaned and one waits until a stable plasma is obtained. Thereafter the shutter is retracted and the substrates become coated. Such a procedure has the benefit that the plasma deposition is stabilised from the start.

Or one can chose to leave the shutter down as long as the plasma is on. For example when the target is cleansed at the end of the coating procedure.

Extinguishing said plasma. This can occur due to too low pressure (as during pump down cycle) or can be done by switching of the target power. The shutter can be left in the extended position in order to prevent target contamination by the other process steps.

The above substeps can be performed between and including the main steps 'b' to 'e'. Cycle time can be saved when the above substeps are performed during the main steps. For example when pumping down (main step 'b') and purging with argon gas between target and shutter, the right pressure (typically 1 Pa) will be reached at a certain moment in time to ignite the plasma by energising the target. The shutter must be extended to prevent that the substrates become contaminated. While now the pressure is further being reduced, the plasma will extinct somewhere around 10 mPa. The system can then be further evacuated in order to reach a base pressure of typically 1 mPa.

In case the shutter completely covers the target, even more flexibility is possible: one can e.g. have an argon atmosphere within the shutter and maintain a plasma while outside the shutter a chemical vapour deposition process takes place with an organic precursor gas. The argon leaking out of the shutter can be used to ionise the precursor gas.

BRIEF DESCRIPTION OF THE DRAWINGS

The invention will now be described into more detail with reference to the accompanying drawings wherein

FIG. 4a shows in perspective view how the shutter can be assembled out of two halves.

FIG. 4b shows in a perspective through view how the shutter can be assembled out of two halves.

In FIGS. 2a, 2b, 3a, 3b, 4a, 4b like numerals indicate like parts.

DESCRIPTION OF THE PREFERRED EMBODIMENTS OF THE INVENTION

Figure 1:
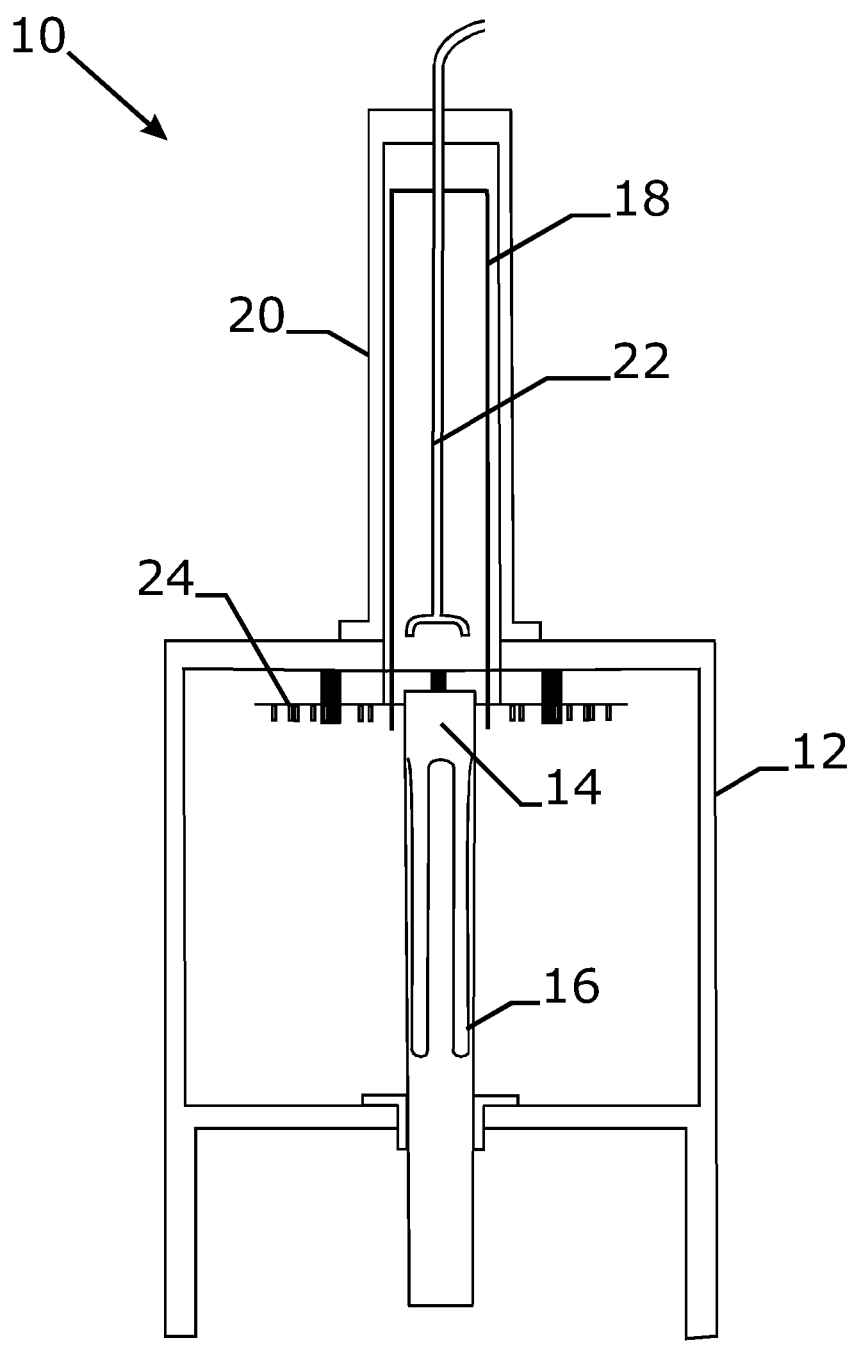
FIG. 1 shows a schematic overview of a mixed mode reactor.

FIG. 1 shows an overall sketch of the inventive apparatus 10. The apparatus basically consists of an evacuable chamber 12 that for this embodiment is of roughly cubical shape. Inside the chamber 12 a cylindrical target 14 is mounted that in this embodiment is placed centrally and upstanding in the chamber 12. When the apparatus is operative, a sputtering area 16 in the form of a meandering racetrack forms on the surface of the target. On top of the apparatus a hat-shaped housing 20 is mounted vacuum tight to the chamber 12. Inside the housing 20 a cylindrical shutter 18 can be moved up and down. When retracted, the shutter uncovers the sputtering area 16. When extended—in this embodiment obtained by lowering the shutter 18—the shutter covers the sputtering area 16. Inside the housing a gas distribution system in the form of a tree 22 is present that feeds processing gas in the gap between the shutter 18 and the target 14. Around the target 14 and the shutter 18 a planetary substrate holder 24 is mounted to which the substrates or the carriers that hold the substrates are fixed.

Figures 2A, 2B:
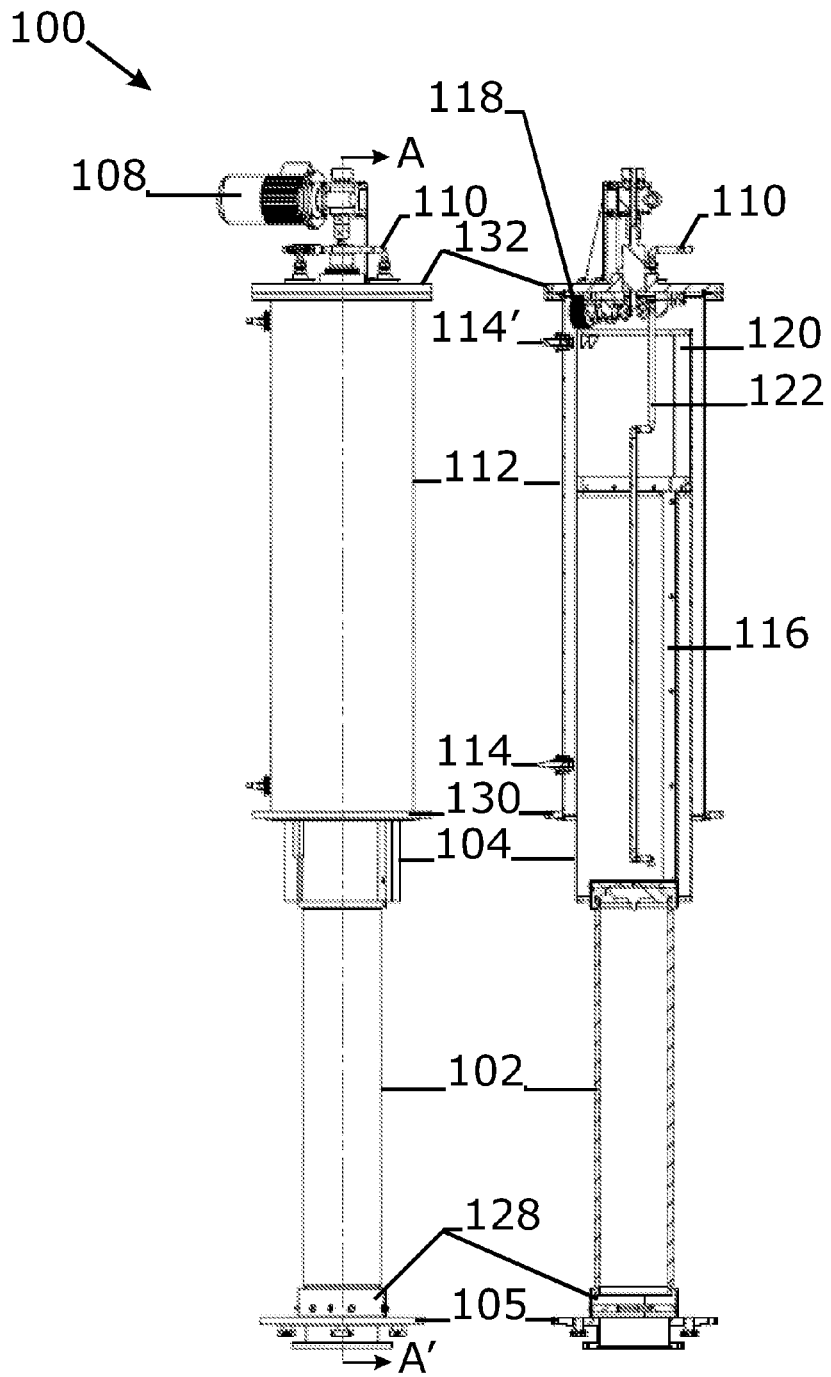
FIG. 2a shows a side view of an embodiment wherein the shutter is in the retracted position.
FIG. 2b shows a cross section of the same embodiment wherein the shutter is in the retracted position.

FIG. 2a is a detailed side view drawing of the retracted shutter in its housing 100. FIG. 2b is a cross section of the same drawing along the plane AA' indicated in FIG. 2a. The housing consists of a tube 112 with a vacuum mounting flange 130 and an end flange 132. The target 102 is rotatably mounted to a mounting flange 105 by means of a target mounting collar 128. Inside the housing the shutter 104 can be moved up and down. The movement is driven by a motor 108 that drives a pair of pulleys 118, 118' that wind up or down a steel cable (not shown) to which the shutter head 120 is attached. The shutter itself 104 is fixed to said shutter head 120. The travel of the shutter head 120 is controlled by two proximity detectors 114 and 114' that signal the beginning and the end of the shutter head travel. Gas tubing 110 is provided to feed gas into the gap between target 102 and shutter 104 through gas tree 122.

Figures 3A, 3B:
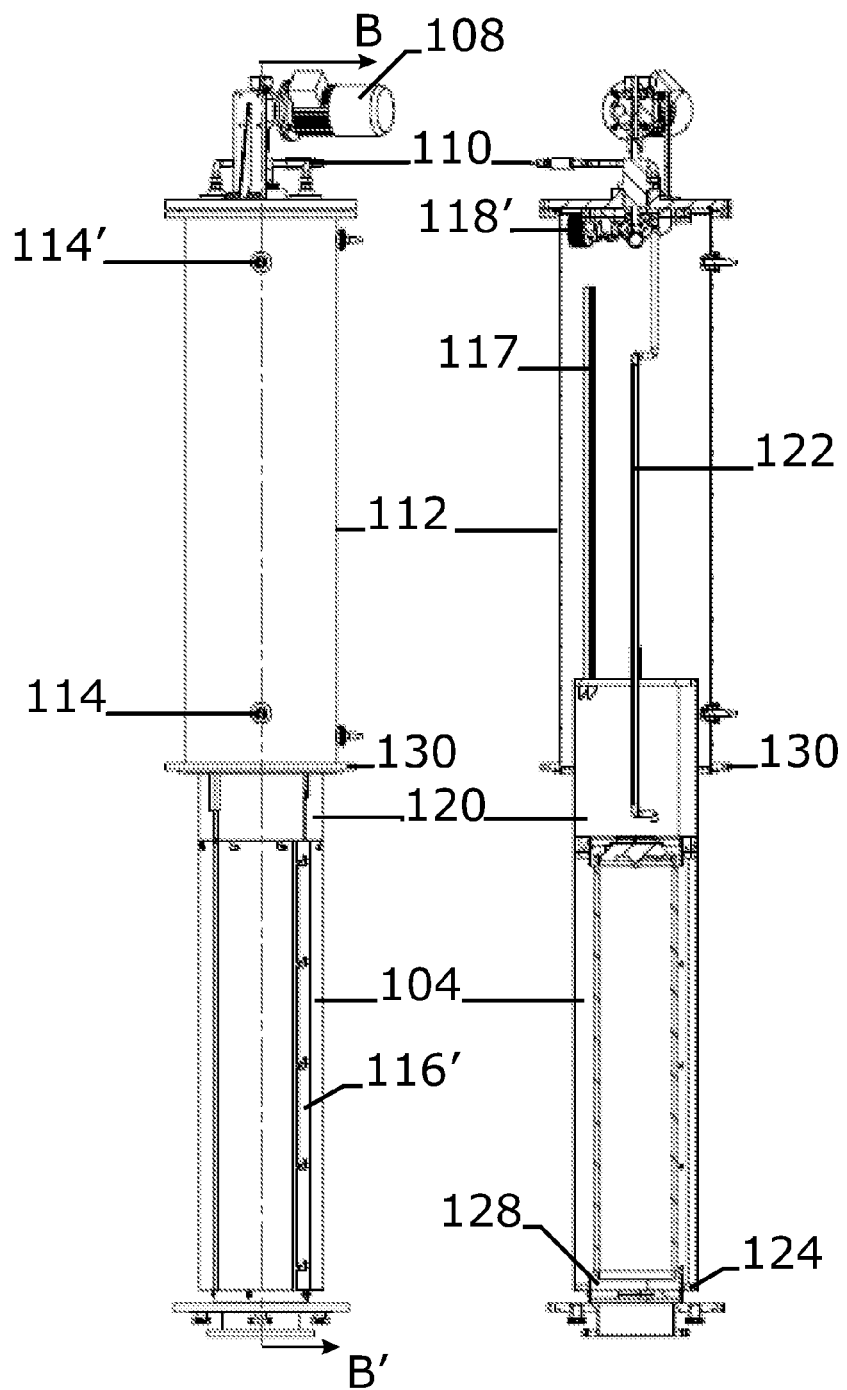
FIG. 3a shows a side view of the same embodiment wherein the shutter is in the extended position.
FIG. 3b shows a cross section of the same embodiment wherein the shutter is in the extended position.

FIGS. 3a and 3b show the target in the extended position. Again FIG. 3a is a side view of the assembly while FIG. 3b is cross section according the plane BB'. Note that the assembly drawing of FIG. 3a is rotated 180° around the axis of the target relative to the drawing FIG. 2a. In the extended position the shutter head 120 has a sliding fit with the mounting flange 130. Now one of the two guiding rails 117 becomes visible. These guiding rails 117, 117' guide the shutter head 120 through the housing tube 112. Also a gas-restraining ring 124 closely fits with the target mounting collar 128.

FIGS. 4a and 4b show a perspective view of the shutter assembly wherein FIG. 4b is a transparent view of FIG. 4a. Here the shutter 104 is shown disassembled. The shutter is built up out of two shells 140, 140' that are jointed together at the overlapping strips 116 and 117, 116' and 117' by means of mating pins and holes. After both shells are assembled, they are fixed to the shutter head 120 by means of a bayonet mount. The protruding rims 126, 126' slide in the guiding rails 117, 117' when the shutter is retracted or extended.

A preferred method to use the apparatus with the shutter described above in a process to deposit a hard and wear resistant coating stack containing titanium and a diamond like coating—like the one described in WO 2005/014882—goes as follows:

The substrates are first loaded on substrate carriers that are subsequently attached to the planetary substrate holder in the inventive apparatus. The target used is an 8" Ti tubular target.

The process starts with the pumping down of the chamber to a base pressure of about 10 mPa. The shutter is lowered so as to cover the sputtering zone. The planetary substrate holder is started.

When the base pressure is reached, argon gas is admitted to the gap while a DC voltage is applied between target and shutter until a plasma ignites around a pressure of about 0.1 Pa.

The target is sputtercleaned for a couple of minutes (say for at least 50 turns of the target).

When now the sputtercleaning has stabilised—as ascertained through the observation of sputter voltage and current—the shutter is retracted and the stream of Ti atoms starts to coat the substrates. Two minutes suffice to obtain a sufficiently thick Ti layer that is useful as an adherence layer.

Additionally to the argon sputtering gas, nitrogen gas is admitted to the chamber gas inlets while the plasma is still on. A layer of TiN starts to grow on top of the surface of the Ti layer. Due to the fact that a rotating target is used, the target does not suffer from target poisoning.

Again after a couple of minutes, the nitrogen flow is stopped and an hydrocarbon precursor gas such as acetylene is admitted while the plasma is still on. The coating deposited on the substrates changes to a TiC layer. The presence of the argon gas—that maintains the plasma glow—and the unbalance of the magnetic array gives the substrates a negative self bias resulting in an ion-plating of the TiC layer. Thermal activation means are switched on in order to thermally excite the organic precursor gas.

Now the shutter is extended over the sputtering region while the plasma is still on and argon gas is admitted in the gap between target and shutter for a final cleaning cycle. Within a minute the plasma is switched off and the argon supply is stopped.

A further diamond like coating forms on the TiC intermediate layer while the pressure inside the chamber is gradually increased to about 1 Pa by admitting the precursor gas.

Once the desired thickness is reached, the system is allowed to cool down, while it is being purged with argon. At atmospheric pressure, the chamber can be opened and the substrates are removed from their carriers.

While the invention has been particularly shown and described with reference to certain preferred embodiments, it will be understood by those skilled in the art that various operations and modifications in form and detail may be made therein.

The invention claimed is:

1. An apparatus for coating of a substrate, comprising:
an evacuable chamber;
a rotatable cylindrical target mounted inside said chamber, where on a surface of said target a sputter area is being sputtered when said apparatus is operative;
a tubular shutter, said shutter being axially extendable to an extended position and retractable to a retracted position, said shutter substantially covering said sputter area in the extended position and said shutter substantially uncovering said sputter area in the retracted position;
a gas distribution system configured to supply gas in a gap between said target and said shutter;
a DC voltage source configured to apply a DC voltage between said target and said shutter until a plasma ignites such that said shutter is configured to be electrically biased relative to said target; and
a plurality of magnets arranged in a fixed magnet array disposed within said target, said target being movable relative to said magnet array,
wherein said shutter provides a gastight enclosure around said target only when said shutter is in the extended position, and said gas distribution system is arranged inside of an inner perimeter of said shutter when said shutter is in the retracted position.

2. The apparatus according to claim 1, wherein said shutter is made of an electrically conductive material.

3. The apparatus according to claim 1, wherein the gap between said shutter and said target is at least wide enough to ignite the plasma between said shutter and said target when said shutter is in the extended position.

4. The apparatus according to claim 1, wherein said shutter covers said target in the extended position and said shutter uncovers said target in the retracted position.

5. The apparatus according to claim 1, wherein said shutter is assembled out of at least two demountable segments.

6. The apparatus according to claim 1, wherein said target and said shutter are mounted centrally in said chamber.

7. The apparatus according to claim 1, wherein said apparatus further comprises a planetary substrate holder for revolving substrates around said target, said planetary substrate holder being configured to provide different levels of rotation to substrate carriers standing on or hanging from said planetary substrate holder, and wherein said tubular shutter is extendable and retractable between said planetary substrate holder and said target.

8. A method to coat substrates in a coating apparatus according to claim 1 comprising the steps of:
a) loading said coating apparatus of claim 1 with said substrates;
b) pumping said chamber to reduce a pressure in said chamber;
c) applying a coating stack on said substrates wherein layers of said stack are applied by a coating process selected out of the group of sputter deposition, reactive sputter deposition, chemical vapor deposition or a combination thereof;
d) when said stack is complete, stopping the coating process;
e) admitting gas to bring said chamber to atmospheric pressure and removing said substrates from said coating apparatus, wherein between or during any of said steps b) to e) a step is introduced comprising the substeps of:
having said tubular shutter extended over said sputter area;
realizing a plasma ignition gas pressure in the gap between said target and said shutter;
igniting the plasma between said target and said shutter;
retracting or not retracting said shutter; and
extinguishing said plasma.

9. A method to coat substrates in a coating apparatus according to claim 1 comprising the steps of:
a) loading said coating apparatus of claim 1 with said substrates;
b) pumping said chamber to reduce a pressure in said chamber;
c) applying a coating stack on said substrates wherein layers of said stack are applied by a coating process selected out of the group of sputter deposition, reactive sputter deposition, chemical vapor deposition or a combination thereof;
d) when sequence a) to c) is completed, stopping the coating process;
e) admitting gas to bring said chamber to atmospheric pressure and removing said substrates from said coating apparatus,
wherein between or during any of said steps b) to e) a step is introduced comprising the substeps of:
having said tubular shutter extended over said target;
realizing a plasma ignition gas pressure in the gap between said target and said shutter;
igniting the plasma between said target and said shutter;
retracting or not retracting said shutter; and
extinguishing said plasma.

10. An apparatus for coating of substrates, comprising:
an evacuable chamber;
a rotatable cylindrical target mounted inside said chamber, where on a surface of said target a sputter area is being sputtered when said apparatus is operative;
a tubular shutter, said shutter being axially extendable to an extended position and retractable to a retracted position, said shutter substantially covering said sputter area in the extended position and said shutter substantially uncovering said sputter area in the retracted position;
a DC voltage source configured to apply a DC voltage between said target and said shutter until a plasma ignites such that said shutter is configured to be electrically biased relative to said target; and
a plurality of magnets arranged in a fixed magnet array disposed within said target, said target being movable relative to said magnet array,
wherein said shutter provides a gastight enclosure around said target only when said shutter is in the extended position, and a gas distribution system is arranged inside of an inner perimeter of said shutter when said shutter is in the retracted position.

11. The apparatus according to claim 1, wherein said plurality of magnets are arranged such that magnet field lines produced by said plurality of magnets penetrate through said target to define a preferred sputter area at an outer surface of said target when said apparatus is operative.

12. The apparatus according to claim 11, further comprising one or more racetracks formed at the outer surface of said target, an arrangement of said racetracks reflecting an arrangement of said plurality of magnets, wherein material of said target is eroded at a faster rate radial under said racetracks than that of material of said target at areas outside of said racetracks.

* * * * *